(12) United States Patent
Zhang et al.

(10) Patent No.: US 12,706,999 B2
(45) Date of Patent: Aug. 11, 2026

(54) TERMINAL DEVICE AND SEAL JIG FOR MANUFACTURING SCREEN MODULE

(71) Applicant: Honor Device Co., Ltd., Shenzhen (CN)

(72) Inventors: Yan Zhang, Shenzhen (CN); Peng Wang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 236 days.

(21) Appl. No.: 18/563,100

(22) PCT Filed: Dec. 13, 2022

(86) PCT No.: PCT/CN2022/138751
§ 371 (c)(1),
(2) Date: Nov. 21, 2023

(87) PCT Pub. No.: WO2023/160135
PCT Pub. Date: Aug. 31, 2023

(65) Prior Publication Data
US 2024/0267450 A1 Aug. 8, 2024

(30) Foreign Application Priority Data
Feb. 23, 2022 (CN) ......................... 202220373909.1

(51) Int. Cl.
*H04M 1/02* (2006.01)
*H04M 1/18* (2006.01)
*H05K 5/06* (2006.01)

(52) U.S. Cl.
CPC ............ *H04M 1/0268* (2013.01); *H05K 5/06* (2013.01); *H04M 1/18* (2013.01)

(58) Field of Classification Search
CPC .. G06F 1/1652; G04G 17/045; H04M 1/0268; H04M 1/0266; H05K 5/06
See application file for complete search history.

(56) References Cited

U.S. PATENT DOCUMENTS 11,800,649 B2 * 10/2023 Burke ...................... H05K 5/03
12,213,260 B2 * 1/2025 Pandya ................ H05K 5/0217
(Continued)

FOREIGN PATENT DOCUMENTS

CN 110444121 A 11/2019
CN 113851044 A 12/2021
(Continued)

OTHER PUBLICATIONS

CN 216697668 U, Tian-FU Guo, Jun. 7, 2022, Fig 6 (Year: 2021).*

*Primary Examiner* — Curtis A Kuntz
(74) *Attorney, Agent, or Firm* — Slater Matsil, LLP

(57) ABSTRACT

This application provides a terminal device and a seal jig. The terminal device provided in this application includes: a screen module. The screen module includes a support layer, a display panel layer arranged above the support layer, a cover plate arranged above the display panel layer, and a module sealant. An edge of the display panel layer includes a bending portion. The bending portion first extends toward a direction away from the cover plate and away from a center of the screen module, and then extends toward a direction away from the cover plate and closer to the center of the screen module, to enable the display panel layer to be bent from above the support layer around an edge of the support layer to below the support layer.

19 Claims, 6 Drawing Sheets

(56) References Cited

U.S. PATENT DOCUMENTS

| | | | | |
|---|---|---|---|---|
| 2015/0256658 | A1 | 9/2015 | Shin et al. | |
| 2016/0062516 | A1 | 3/2016 | Jeong et al. | |
| 2019/0051858 | A1 | 2/2019 | Tomioka et al. | |
| 2020/0057472 | A1 | 2/2020 | Kang et al. | |
| 2020/0205307 | A1 | 6/2020 | Hooton et al. | |
| 2021/0063806 | A1 | 3/2021 | Kim et al. | |
| 2021/0405688 | A1* | 12/2021 | Barrett .................... | G09F 9/301 |
| 2022/0061166 | A1 | 2/2022 | Burke et al. | |

FOREIGN PATENT DOCUMENTS

| | | | |
|---|---|---|---|
| CN | 114079022 | A | 2/2022 |
| CN | 216697668 | U | 6/2022 |
| CN | 115083285 | A | 9/2022 |
| CN | 217606494 | U | 10/2022 |
| CN | 115482737 | A | 12/2022 |
| EP | 2916194 | A1 | 9/2015 |
| EP | 2993564 | A1 | 3/2016 |

* cited by examiner

TERMINAL DEVICE AND SEAL JIG FOR MANUFACTURING SCREEN MODULE

CROSS-REFERENCE TO RELATED APPLICATIONS

This application is a national stage of International Application No. PCT/CN2022/138751, filed on Dec. 13, 2022, which claims priority to Chinese Patent Application No. 202220373909.1, filed on Feb. 23, 2022. The disclosures of both of the aforementioned applications are hereby incorporated by reference in their entireties.

TECHNICAL FIELD

This application relates to the field of electronic device manufacturing technologies, and in particular, to a terminal device and a seal jig for manufacturing a screen module.

BACKGROUND

With the development of the times, mobile phones have become multi-functional portable devices that integrate communication, audio and video, reading, and photography. Especially in recent years, with the rapid development of full-screen displays, large screen-to-body ratios have become the mainstream demand. Therefore, a proper structural design of a screen module that serves as a main component is particularly important.

A mobile phone includes a middle frame and a screen module fastened on the middle frame. The screen module includes a cover plate arranged uppermost. A step groove with an opening facing toward the cover plate is provided on an upper edge of the middle frame. When the screen module is fastened on the middle frame, the cover plate is fastened on the step groove. There is a gap between the cover plate and the step groove, a coating adhesive is arranged at the gap, and the cover plate is connected to the step groove by the coating adhesive. Other components of the screen module are arranged in an accommodating space formed by the cover plate and the middle frame. In this case, in the other components included in the screen module, a display panel layer (panel) is closest to the middle frame. In consideration of that a specific width dimension needs to be ensured at a joint between the cover plate and the middle frame to ensure connection reliability, in consideration of structural interference between the other screen components of the screen module other than the cover plate and the middle frame after positions of the middle frame and the cover plate are determined, and in consideration of impact of a structural relationship between the display panel layer and the middle frame on communication performance of the mobile phone, a specific avoidance distance is required between an edge of the display panel layer and an edge of the cover plate that is close to the display panel layer.

However, ensuring the avoidance distance causes over-large sizes of the screen module and the whole device, which cannot satisfy consumers' pursuit of an exquisite appearance. Therefore, how to reduce an avoidance distance on an edge of the screen module has become a focus of attention of a product.

SUMMARY

This application provides a terminal device and a seal jig for manufacturing a screen module, to resolve a technical problem of reducing an avoidance distance on an edge of the screen module.

According to a first aspect, this application provides a terminal device. The terminal device includes: a screen module. The screen module includes a support layer, a display panel layer arranged above the support layer, a cover plate arranged above the display panel layer, and a module sealant. An edge of the display panel layer includes a bending portion. The bending portion first extends toward a direction away from the cover plate and away from a center of the screen module, and then extends toward a direction away from the cover plate and closer to the center of the screen module, to enable the display panel layer to be bent from above the support layer around an edge of the support layer to below the support layer. The module sealant is arranged in a gap between the bending portion and the support layer. The module sealant is further arranged on a side of the bending portion facing away from the support layer. One end of the module sealant is connected to a surface of the cover plate facing toward the display panel layer, and an other end extends, to below the display panel layer, toward a direction away from the cover plate, to enable the bending portion to be fully covered in the module sealant.

In this way, the bending portion is fully covered in the module sealant, so that the bending portion is no longer exposed, and there is no need to consider an avoidance distance between the bending portion and an edge of the cover plate, thereby reducing the avoidance distance. Further, the module sealant is cured to cover the bending portion, which, compared with "ensuring an avoidance distance from an edge of the display panel layer to an edge of the cover plate", may produce a more reliable protection effect on the display panel layer, because "ensuring an avoidance distance from an edge of the display panel layer to an edge of the cover plate" can only keep the display panel layer below the cover plate. When the display panel layer is subjected to external forces in directions other than a direction parallel to a thickness direction of the cover plate, panel wire breakage may still occur. However, the bending portion in this application is fully covered in the module sealant, so that the display panel layer can be protected from all angles. While satisfying the condition of protecting the display panel layer, a minimum distance between the module sealant and the display panel layer that is set in this application is much smaller than the avoidance distance. Therefore, this application not only can reduce the avoidance distance, to reduce the distance between the edge of the display panel layer and the edge of the cover plate, but also can further improve the reliability of protecting the display panel layer. In addition, in the terminal device provided in this embodiment, an inner side and an outer side of a bend of a COP are filled with an adhesive, which is cured to form the module sealant, to produce a corrosion-resistant effect such as waterproofing and oil-proofing.

In some embodiments, a thickness of the module sealant in a direction perpendicular to the cover plate is greater than a distance between an end of the bending portion away from the cover plate and the cover plate, to enable the bending portion to be fully covered in the module sealant.

In some embodiments, the display panel layer extends from the end of the bending portion away from the cover plate to below the support layer, to form a first extending portion. The thickness of the module sealant in a direction perpendicular to the cover plate is greater than a distance between a surface of the first extending portion facing away from the cover plate and the cover plate. An end of the module sealant facing away from the cover plate extends by a first preset distance toward a direction closer to the first extending portion, to enable a part of the first extending portion to be wrapped in the module sealant. In this way, even if a structure of the display panel layer is subjected to an external force parallel to the thickness direction of the cover plate and toward a direction of the cover plate, the display panel layer can be protected.

In some embodiments, on a side on which the bending portion is arranged, an end of the module sealant away from the display panel layer is located between the edge of the display panel layer and an edge of the cover plate. In this way, the module sealant is retracted in the cover plate, so that when the screen module is assembled to a housing, the assembly is more convenient.

In some embodiments, the terminal device further includes: a middle frame. The middle frame includes a bottom plate. A second extending portion is arranged around an edge of the bottom plate, and the second extending portion extends by a specific height toward a direction closer to the screen module, to form a cavity. The screen module is arranged in the cavity. A lower surface of the cover plate is below an upper surface of the middle frame. The module sealant, the cover plate, and the middle frame form a gap on a side close to the bending portion, which is parallel to a thickness of the cover plate.

In this way, when the cover plate and the middle frame are assembled together, the lower surface of the cover plate is below the upper surface of the middle frame. When a joint between a side surface of the cover plate and the middle frame is subjected to an external force, the cover plate and the middle frame form an effective limitation in a direction parallel to the thickness direction of the cover plate, to prevent deformation of the middle frame from causing an impact on the display panel layer and wire breakage of the display panel layer. Further, on the side on which the bending portion is arranged, the end of the module sealant away from the display panel layer is located between the edge of the display panel layer and the edge of the cover plate, so that the module sealant is retracted from the cover plate by a specific distance. An effective limitation may be formed by the side surface of the cover plate and the middle frame, to prevent deformation of the reliable middle frame from causing an impact on the COP and causing wire breakage of the COP, so that there is no need to consider the avoidance distance between the bending portion and the edge of the cover plate. In this way, the avoidance distance between the bending portion and the edge of the cover plate can be reduced. Using the module sealant provided in this application not only can reduce the avoidance distance, to reduce the distance between the edge of the display panel layer and the edge of the cover plate, but also can reduce the avoidance distance of the edge of the screen module and a thickness of a side wall of the middle frame of the whole device. In addition, in the terminal device provided in this embodiment, there may be no adhesive dispensing between the middle frame and the cover plate. When external water, grease, or the like penetrates into the terminal device through a gap between the middle frame and the cover plate, the module sealant is equivalent to forming a seal for the display panel layer, to provide the display panel layer from corrosion and maintain a stable shape.

In some embodiments, the screen module further includes a connecting portion. The cavity includes a bottom surface. The connecting portion is arranged between the bottom surface and the module sealant. One end of the connecting portion is connected to the end of the module sealant away from the cover plate, and an other end of the connecting portion is connected to the bottom surface. In this way, compared with applying an adhesive to a side wall perpendicular to the cover plate, applying adhesive to the bottom surface can avoid negative impact of an external force parallel to the thickness direction of the cover plate on connection reliability.

In some embodiments, the terminal device further includes: a fastening component. The fastening component is arranged on a side close to the bending portion. One end of the fastening component is arranged on an outer end surface of the middle frame close to the bending portion, and an other end of the fastening component is arranged in the module sealant, to enable the fastening component to pass through the middle frame and the gap and to be connected to the module sealant. This prevents longitudinal dislocation or detachment between the screen module and the middle frame under the action of an external force.

In some embodiments, the module sealant includes a U-shaped region, and the U-shaped region is located at the end of the module sealant away from the cover plate; and the connecting portion is arranged on the U-shaped region.

In some embodiments, in another region of the display panel layer in which the bending portion is not arranged, the module sealant is arranged around the whole edge of the display panel layer, and an end surface of the module sealant is located between a side-surface edge of the display panel layer and the edge of the cover plate.

In some embodiments, a shape and a size of the connecting portion are adapted to a shape and a size of an end surface of the module sealant away from the bottom plate.

According to a second aspect, this application provides a seal jig for manufacturing a screen module. The screen module includes a support layer, a display panel layer arranged above the support layer, a cover plate arranged above the display panel layer, and a module sealant. An edge of the display panel layer includes a bending portion. The bending portion first extends toward a direction away from the cover plate and away from a center of the screen module, and then extends toward a direction away from the cover plate and closer to the center of the screen module, to enable the display panel layer to be bent from above the support layer around an edge of the support layer to below the support layer. The seal jig is arranged at an end close to the bending portion. One end of the seal jig is connected to the cover plate, an other end of the seal jig is lapped with an end surface of the display panel layer away from the cover plate, to enable the seal jig, the cover plate, and the display panel layer to form a cavity.

BRIEF DESCRIPTION OF THE DRAWINGS

To describe the technical solutions in embodiments of this application more clearly, the accompanying drawings that need to be used in the embodiments are briefly described below. Apparently, a person of ordinary skill in the art may further derive other drawings from these accompanying drawings without creative efforts.

1—cover plate, 11—first end, and 12—second end; 2—display panel layer, 21—plane layer, 22—bending portion, 23—first extending portion, and 24—first side surface; 3—module sealant, and 31—second side surface; 4—connecting portion; 5—fastening component; 6—seal jig;

100—screen module, 101—optically clear adhesive layer, 102—polarizing layer, 103—support layer, 104—super clean foam layer, 105—heightening block, and 106—panel protecting layer; 200—middle frame, 201—cavity, 202—bottom surface, 203—gap, 204—bottom plate, 205—second extending portion, and 206—step groove; and 300—adhesive layer.

DETAILED DESCRIPTION OF THE EMBODIMENTS

For ease of description of the technical solutions of this application, some concepts related in this application are first described below. Preferred embodiments of this application are provided in the accompanying drawings. However, this application may be implemented in many different forms and is not limited to embodiments described herein. On the contrary, the embodiments are provided to make understanding of the disclosed content of this application more thorough and comprehensive.

Figure 1:
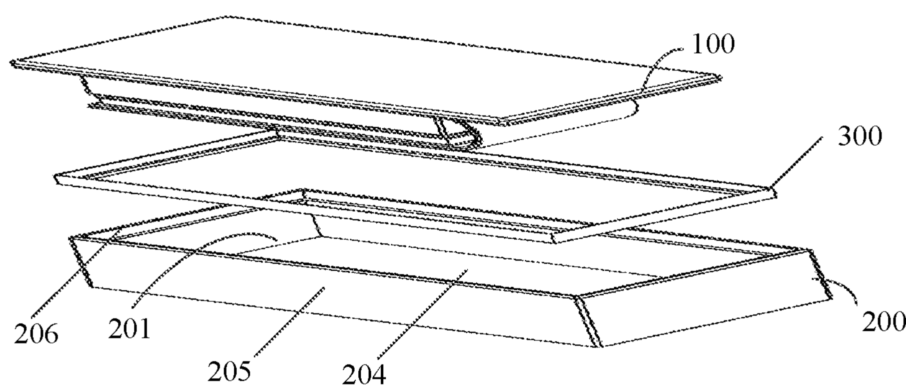
FIG. 1 an exploded view of an existing mobile phone.

A terminal device in embodiments of this application may be: a mobile terminal or a stationary terminal having a touch control screen, such as a mobile phone, a tablet computer (portable android device, PAD), a personal digital assistant (personal digital assistant, PDA), a handheld device having a wireless communication function, a computing device, an on-board device or a wearable device, a virtual reality (virtual reality, VR) terminal device, an augmented reality (augmented reality, AR) terminal device, a wireless terminal in industrial control (industrial control), a wireless terminal in self driving (self driving), a wireless terminal in remote medical (remote medical), a wireless terminal in a smart grid (smart grid), a wireless terminal in transportation safety (transportation safety), a wireless terminal in a smart city (smart city), or a wireless terminal in a smart home (smart home). A form of the terminal device is not specifically limited in embodiments of this application. FIG. 1 is presented using an example in which the terminal device is a mobile phone, and an actual application is not limited thereto.

Figure 2:
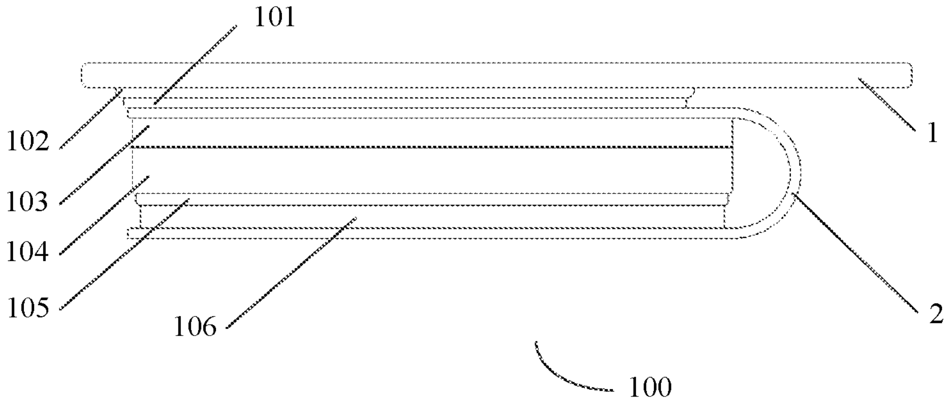
FIG. 2 is a schematic diagram of a structure of an existing screen module.

FIG. 1 an exploded view of an existing mobile phone. As shown in FIG. 1, the mobile phone includes a middle frame 200 and a screen module 100 fastened on the middle frame 200. The middle frame 200 includes a bottom plate 204, a second extending portion 205 is arranged around an edge of the bottom plate 204, and the second extending portion 205 extends by a specific height toward a direction closer to the screen module 100, to form a cavity 201. The cavity 201 can accommodate the screen module 100. As shown in FIG. 2, the screen module 100 includes a support layer 103, a chip display panel layer 2 arranged above the support layer 103, a polarizing layer 102 (port of loading, POL) arranged above the display panel layer 2, an optically clear adhesive layer 101 arranged above the POL layer 102, and a cover plate 1 arranged above the OCR layer 101. The optically clear adhesive layer 101 may be optically clear adhesive (optical clear adhesive, OCA), or may be optically clear resin (optical clear resin, OCR). An edge of the display panel layer 2 includes a bending portion 22. The bending portion 22 first extends toward a direction away from the cover plate 1 and away from a center of the screen module 100, and then extends toward a direction away from the cover plate 1 and close to the center of the screen module 100, to enable the display panel layer 2 to be bent from above the support layer 103 around the support layer 103 to below the support layer 103. A step groove 206 is provided at an end of the second extending portion 205 away from the bottom plate, and an opening of the step groove 206 faces toward the cover plate 1. When the screen module 100 is fastened on the middle frame 200, the cover plate 1 is fastened on the step groove. There is a gap between the cover plate 1 and the step groove 206, a coating adhesive 300 is arranged at the gap, and the cover plate 1 is connected to the step groove 206 by the coating adhesive 300.

In some implementations, a super clean foam layer 104 (super clean foam, SCF), a heightening block 105, and a panel protecting layer 106 may be sequentially arranged below the support layer 103. In this case, the bending portion 22 is bent to below the panel protecting layer 106.

Because the bending portion 22 of the display panel layer 2 extends out, compared with other screen components, a minimum distance between the display panel layer 2 and an end of the cover plate 1 close to the bending portion 22 is smaller.

Figure 3:
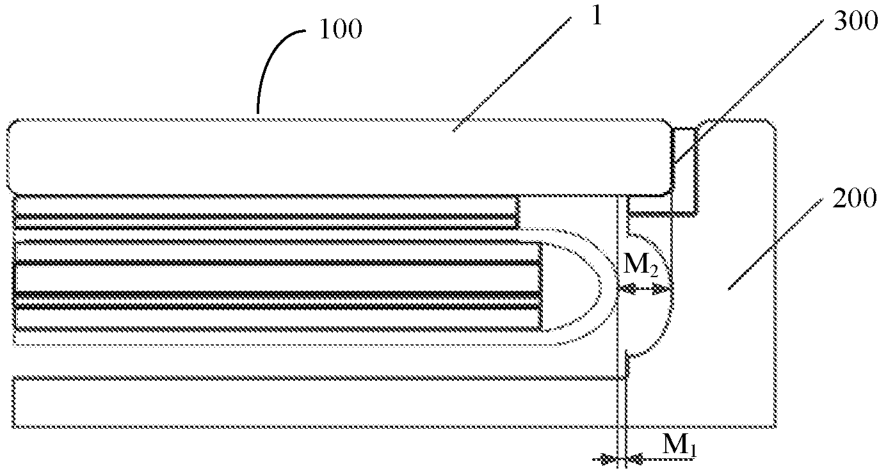
FIG. 3 is a schematic diagram of a structure of a tail portion after assembly of an existing screen module and a middle frame.
Figure 4:
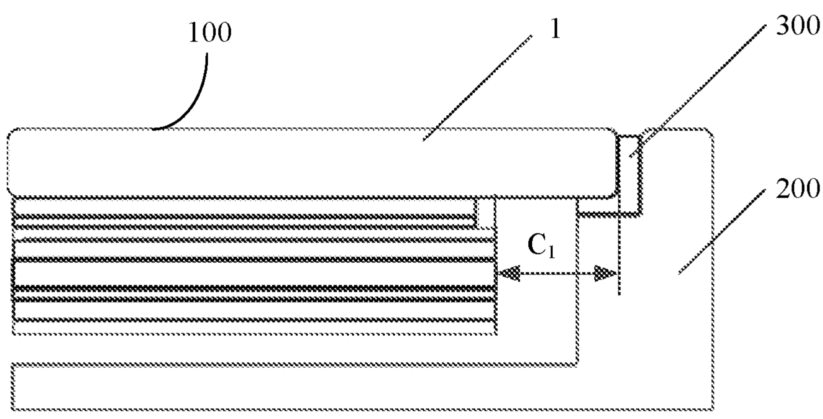
FIG. 4 is a schematic diagram of a structure of a side surface after assembly of an existing screen module and a middle frame.

As shown in FIG. 3 and FIG. 4, in consideration of that a specific width dimension needs to be ensured at a joint between the cover plate 1 and the middle frame 200 to ensure connection reliability, in consideration of structural interference between other screen components of the screen module other than the cover plate 1 and the middle frame 200 after positions of the middle frame 200 and the cover plate 1 are determined, and in consideration of impact of a structural relationship between the display panel layer 2 and the middle frame 200 on communication performance of the mobile phone, a specific avoidance distance is required between an edge of the display panel layer 2 and an edge of the cover plate 1 that is close to the display panel layer 2. On a side of the display panel layer 2 on which the bending portion 22 is arranged, an avoidance distance $M_2$ between the bending portion 22 and the edge of the cover plate 1 is usually greater than 0.55 mm. In another region of the display panel layer 2 in which the bending portion 22 is not arranged, a distance $C_1$ between the edge of the display panel layer 2 and the edge of the cover plate 1 is usually greater than 0.90 mm. It should be noted that, the distance $C_1$ includes an adhesive dispensing distance between the cover plate and the middle frame and an avoidance distance between the display panel layer and the middle frame.

As shown in FIG. 3, on the side of the display panel layer 2 on which the bending portion 22 is arranged, because a distance $M_1$ between an inner side wall of the middle frame 200 close to the bending portion 22 and the bending portion 22 is less than a distance $M_2$ between the bending portion 22 and the edge of the cover plate 1, a groove is usually opened on a side of the middle frame 200 close to the display panel layer. A shape of the groove is adapted to a shape of the display panel layer. In this way, a spacing between the middle frame 200 and the display panel layer is ensured, to avoid the display panel layer from having wire breakage or a black spot appeared on a side when the middle frame 200 and the cover plate 1 are degummed or the middle frame 200 is deformed in a test of the whole device. In addition, in another region of the display panel layer 2 in which the bending portion 22 is not arranged, a groove may alternatively be opened on the middle frame 200, to produce an effect the same as that of the foregoing structure.

However, ensuring the avoidance distance causes oversize sizes of the screen module and the whole device, which cannot satisfy consumers' pursuit of an exquisite appearance. In addition, by only ensuring the avoidance distance, the middle frame 200, the cover plate 1, and the display panel layer 2 to form the cavity to protect the display panel layer 2, the problem that the display panel layer 2 has wire breakage or a black spot appeared on a side cannot be completely resolved. When the middle frame 200 and the cover plate 1 are degummed, or the middle frame 200 is deformed, if a stress of the display panel layer 2 exceeds a threshold, the display panel layer 2 may still have wire breakage.

Figure 5:
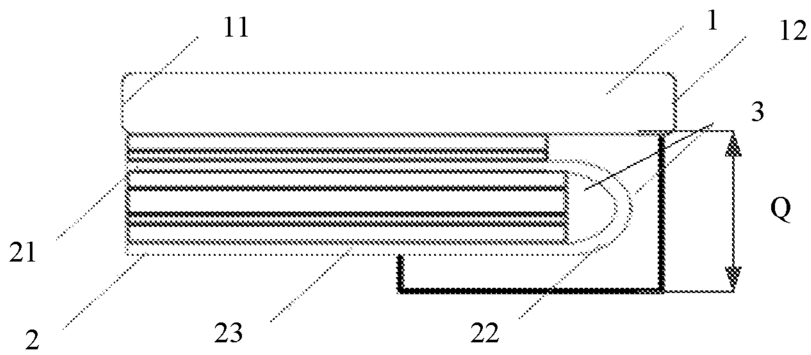
FIG. 5 is a schematic diagram of a structure of an embodiment of a screen module according to this application.

To resolve the foregoing problems, this application provides a terminal device. The terminal device includes a screen module. As shown in FIG. 5, the screen module 100 includes a support layer 103, a display panel layer 2 arranged above the support layer 103, a cover plate 1 arranged above the display panel layer 2, and a module sealant 3. The display panel layer 2 includes a plane layer 21. An end of the plane layer 21 includes a bending portion 22. The bending portion 22 first extends toward a direction away from the cover plate 1 and away from a center of the screen module 100, and then extends toward a direction away from the cover plate 1 and closer to the direction of the center of the screen module 100. The module sealant 3 is arranged in a gap between the bending portion 22 and the support layer 103. The module sealant 3 is further arranged on a side of the bending portion 22 facing away from the support layer 103. One end of the module sealant 3 is connected to a surface of the cover plate 1 facing toward the display panel layer 2, and an other end extends, to below the display panel layer 2, toward a direction away from the cover plate 1, to enable the bending portion 22 to be fully covered in the module sealant 3.

In some embodiments, a thickness of the module sealant 3 in a direction perpendicular to the cover plate 1 is greater than a distance between the cover plate 1 and an end of the bending portion 22 that is away from the cover plate 1, to enable the bending portion 22 to be fully covered in the module sealant 3. It may be understood that, being fully covered means that the module sealant is not only arranged in the gap between the display panel layer and the support layer, but also arranged on an exterior of the display panel layer. In this way, surroundings of the bending portion 22 in the display panel layer 2 are filled with an adhesive, to prevent the display panel layer 2 in the module sealant 3 from being subjected to a force, thereby avoiding wire breakage of the display panel layer 2.

In some embodiments, in another region of the display panel layer 2 in which the bending portion 22 is not arranged, the module sealant 3 is arranged around the whole edge of the display panel layer 2, and an end surface of the module sealant 3 is located between a side-surface edge of the display panel layer 2 and the edge of the cover plate 1.

In an embodiment, the edge of the display panel layer 2 includes the bending portion 22, and the bending portion 22 is bent from above the support layer toward a direction away from the cover plate 1 and around an edge of the support layer 103, and extends to below the support layer 103.

In some embodiments, the display panel layer 2 extends from the end of the bending portion 22 away from the cover plate 1 to below the support layer, to form a first extending portion 23. In some embodiments, a thickness of the module sealant 3 in a direction perpendicular to the cover plate 1 is greater than a distance between a surface of the first extending portion 23 facing away from the cover plate 1 and a surface of an inner side of the cover plate 1, to enable the bending portion 22 to be fully covered in the module sealant 3. In this way, surroundings of the bending portion 22 in the display panel layer 2 are filled with an adhesive, to prevent the display panel layer 2 in the module sealant 3 from being subjected to a force, thereby avoiding wire breakage of the display panel layer 2.

Figure 6A:
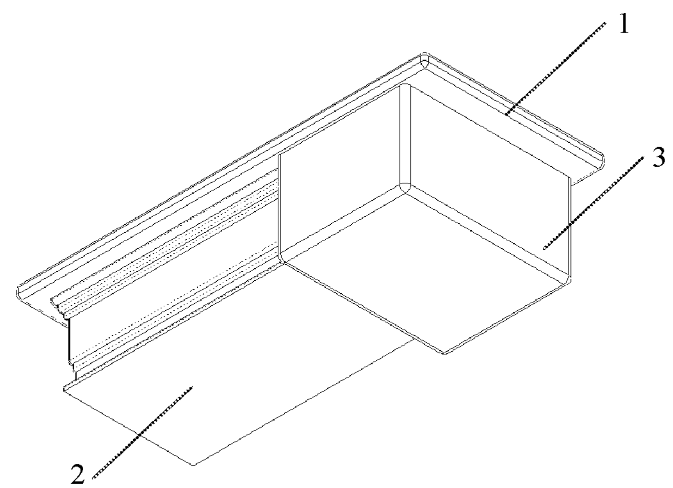
FIG. 6*a* is a schematic diagram of a structure of an embodiment of a screen module according to this application.
Figure 6B:
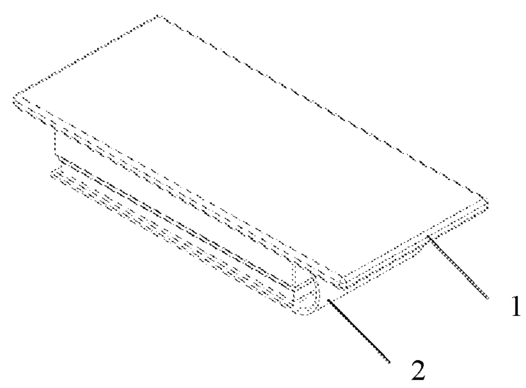
FIG. 6*b* is a schematic diagram of a structure of the screen module provided in FIG. 6*a* after a module sealant is hidden.

As shown in FIG. 6a and FIG. 6b, to present other structures inside the module sealant 3, FIG. 6b shows a schematic diagram of a structure of the screen module after the module sealant 3 is hidden. It can be learned that the module sealant 3 fills a gap formed by the display panel layer 2 and the other structures of the screen module, and a packaging structure with a specific thickness is also formed on the exterior of the display panel layer 2.

Figure 6C:
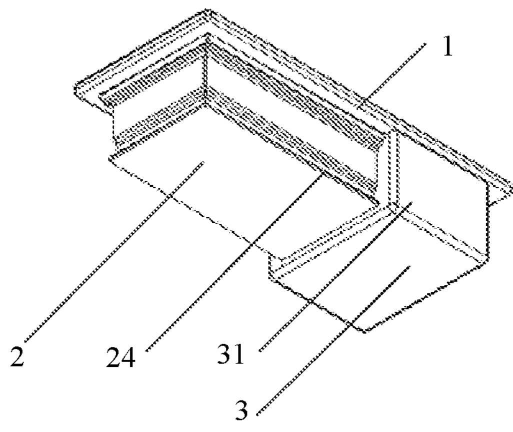
FIG. 6*c* is a schematic diagram of a structure of an embodiment of a screen module according to this application.

In some embodiments, as shown in FIG. 6c, the display panel layer 2 includes a first side surface 24, and the first side surface 24 is an end surface parallel to the thickness 1 of the cover plate. The module sealant 3 includes a second side surface 31, and the second side surface 31 is located on a side of the first side surface 24 away from the display panel layer 2. In this way, protection for the side surface of the display panel layer 2 is formed.

Preferably, the module sealant 3 is made of a silica gel-based material.

In some embodiments, an end of the module sealant 3 away from the cover plate 1 extends by a specific distance toward a direction closer to the screen module 100, to enable a part of the first extending portion 23 to be wrapped in the module sealant 3.

In some embodiments, an end of the bending portion 22 closest to a second end 12 is located on a side of the second end 12 close to a first end 11. The second end 12 refer to an end of the cover plate 1 close to the bending portion 22, and the first end 11 refers to an end of the cover plate 1 away from the bending portion 22.

In some embodiments, the module sealant 3 is located between the second end 12 and the first end 11, so that the module sealant 3 is retracted in the second end 12, that is, retracted in a region of the cover plate 1.

Figure 7:
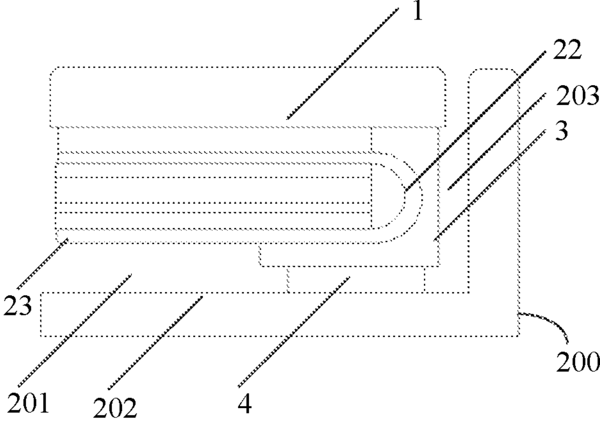
FIG. 7 is a schematic diagram of a structure of an embodiment of a terminal device according to this application.

As shown in FIG. 7, this application further provides a terminal device. The terminal device includes a middle frame 200 and a screen module 100. The middle frame 200 includes a bottom plate 204, a second extending portion 205 is arranged around an edge of the bottom plate 204, and the second extending portion 205 extends by a specific height toward a direction closer to the screen module 100, to form a cavity 201. The cavity 201 includes a bottom surface 202. The screen module 100 includes a cover plate 1, and a display panel layer 2, a module sealant 3, and a connecting portion 4 arranged on an inner side of the cover plate 1. The display panel layer 2 includes a plane layer 21, a bending portion 22, and a first extending portion 23. The module sealant 3 wraps the bending portion 22 and covers a part of a structure of the first extending portion 23. The connecting portion 4 is located between the bottom surface 202 and the module sealant 3. One end of the connecting portion 4 is connected to an end of the module sealant 3 away from the cover plate 1, and an other end of the connecting portion 4 is connected to the bottom surface 202.

In some embodiments, the module sealant 3 is retracted in the cover plate 1 (for a structure of the module sealant 3, refer to the foregoing embodiment). In this way, when the cover plate 1 and the middle frame are assembled together, a lower surface of the cover plate 1 is below an upper surface of the middle frame 200, a side surface of the cover plate 1 and the middle frame 200 may form an effective limitation, to prevent deformation of the middle frame from causing an impact on the display panel layer and wire breakage of the display panel layer.

In an embodiment, the connecting portion may be obtained in a manner of adhesive applying.

In an embodiment, the connecting portion may be obtained in a manner of adhesive dispensing.

It can be learned from the foregoing embodiment that the module sealant 3 wraps the bending portion 22 and covers a part of the structure of the first extending portion 23. In addition, the connecting portion 4 connects the module sealant 3 to the middle frame 200. In such a connection manner, the display panel layer 2 wrapped by the module sealant 3 is not affected by an external force, especially an external force parallel to a thickness 1 direction of the cover plate to avoid wire breakage of the display panel layer 2. In addition, since the cover plate 1 is not directly connected to the middle frame 200, a structure adapted to a structure of the cover plate may not be arranged on the middle frame 200, for example, a step groove for assembly, or for another example, a groove for avoid the bending portion 22.

In an embodiment, the module sealant 3, the connecting portion 4, and the middle frame 200 form a gap 203. The module sealant 3 and the middle frame 200 may be connected in a manner of adhesive dispensing in the gap 203, to further strengthen the connection between the middle frame 200 and the screen module 100.

Figure 8:
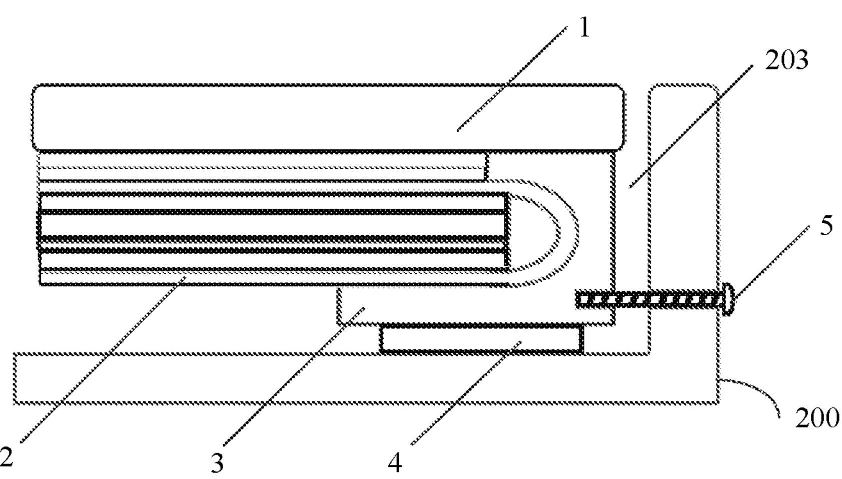
FIG. 8 is a schematic diagram of a structure of an embodiment of a terminal device according to this application.

As shown in FIG. 8, in some embodiments, the terminal device further includes a fastening component 5. One end of the fastening component 5 is arranged on an outer end surface of the middle frame 200 close to the bending portion 22, and an other end is arranged in the module sealant 3. In this way, the fastening component 5 passes through the middle frame 200 and the gap 203 and is connected to the module sealant 3, to further strengthen the connection between the middle frame 200 and the screen module 100. For a mounting position of the fastening component 5, a position at which interference with the display panel layer 2 may occur is avoided. The fastening component 5 may be a tapping screw or a standard screw. A through hole or a nut corresponding to the tapping screw or the standard screw may be arranged on the middle frame 200 and the module sealant 3, to implement a connection between the fastening component 5 and the middle frame 200 and connection between the fastening component 5 and the module sealant 3.

Figure 9A:
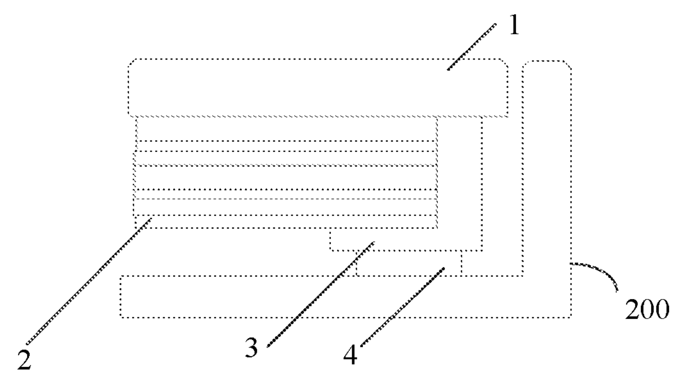
FIG. 9*a* is a schematic diagram of a structure of an embodiment of a terminal device according to this application.
Figure 9B:
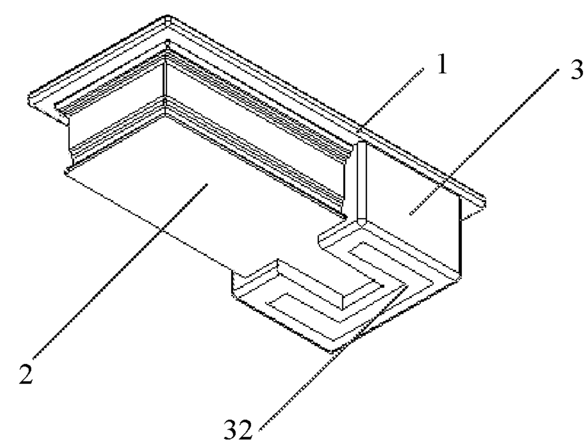
FIG. 9*b* is a schematic diagram of a structure of an embodiment of a screen module in the terminal device provided in FIG. 9*a;*

As shown in FIG. 9*a* and FIG. 9*b*, in some embodiments, the module sealant 3 is connected to the middle frame 200 by the connecting portion 4. The module sealant 3 includes a U-shaped region 32, and the U-shaped region 32 is a region on an end of the module sealant 3 away from the cover plate 1. The connecting portion 4 is arranged on the U-shaped region 32.

Figure 10:
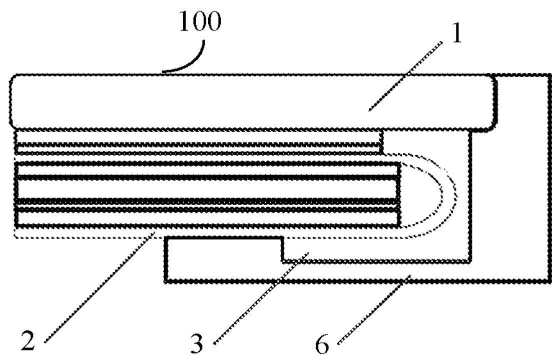
FIG. 10 is a schematic diagram of a structure of an embodiment of a jig for manufacturing a screen module according to this application.

This application further provides a process method for manufacturing the screen module 100 in the foregoing embodiments. As shown in FIG. 10, the process method includes the following steps.

Step 1: Arrange the screen module 100 in a seal jig 6, where one end of the seal jig 6 is connected to a cover plate 1, an other end of the seal jig 6 is lapped with an innermost end surface (usually, an end of a display panel layer 2 farthest from the cover plate 1) of the module, and the seal jig 6, the cover plate 1, and the display panel layer 2 form a cavity.

Step 2: Fill the cavity with an adhesive, to fill up an inner side of a bending portion of the display panel layer and an outer side of the display panel layer.

Step 3: Cure the adhesive gradually over time, to form a module sealant 3, where the module sealant 3 wraps the display panel layer, to prevent the bending portion of the display panel layer from being exposed. Therefore, a stable shape of the display panel layer is maintained while water-proofing and oil-proofing are implemented.

Step 4: Detach the seal jig 6, to obtain the screen module 100.

Figure 11A:
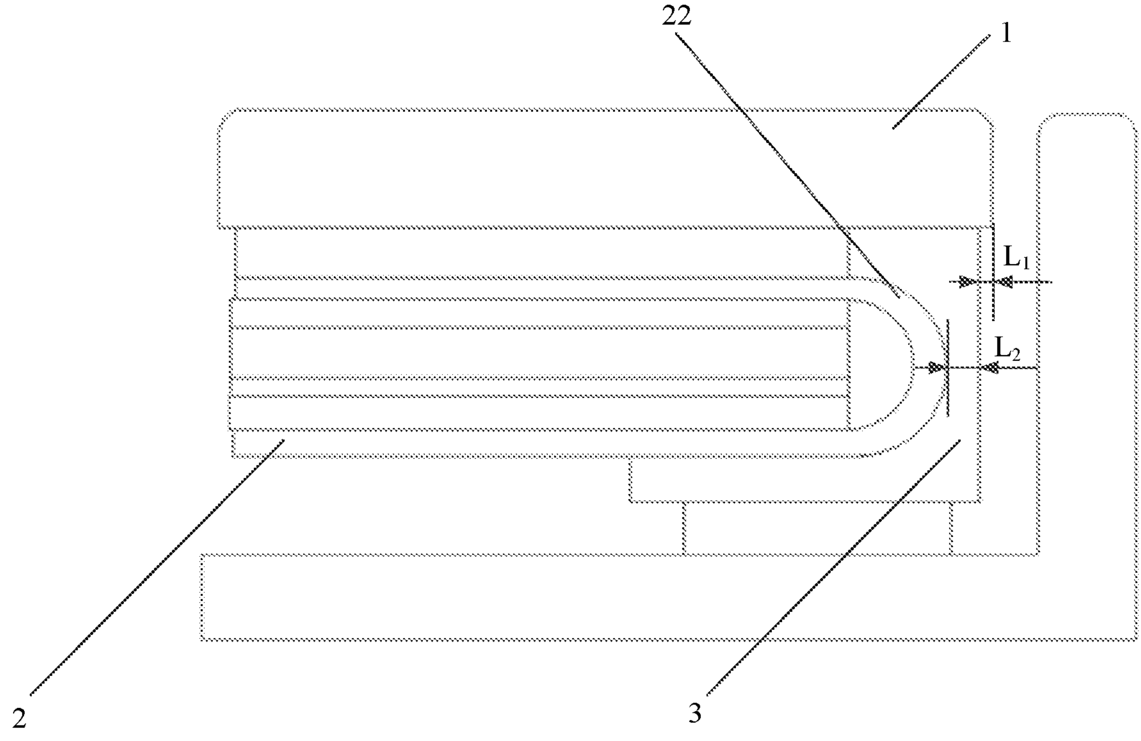
FIG. 11*a* is a schematic diagram of a structure of an embodiment of a terminal device according to this application.

As shown in FIG. 11*a*, in a specific implementation, on a side of the display panel layer 2 on which the bending portion 22 is arranged, a distance $L_1$ between an end of the module sealant 3 away from the display panel layer 2 and an edge of the cover plate 1 in the screen module 100 provided in this application is 0.10 mm, and a minimum distance $L_2$ between the display panel layer 2 and the end of the module sealant 3 away from the display panel layer 2 is 0.20 mm, where a total is 0.30 mm. Compared with that a minimum distance $M_2$ between an existing display panel layer and the end of the cover plate 1 away from the display panel layer 2 usually needs to be greater than 0.55 mm, an expected gain is greater than 0.25 mm.

Figure 11B:
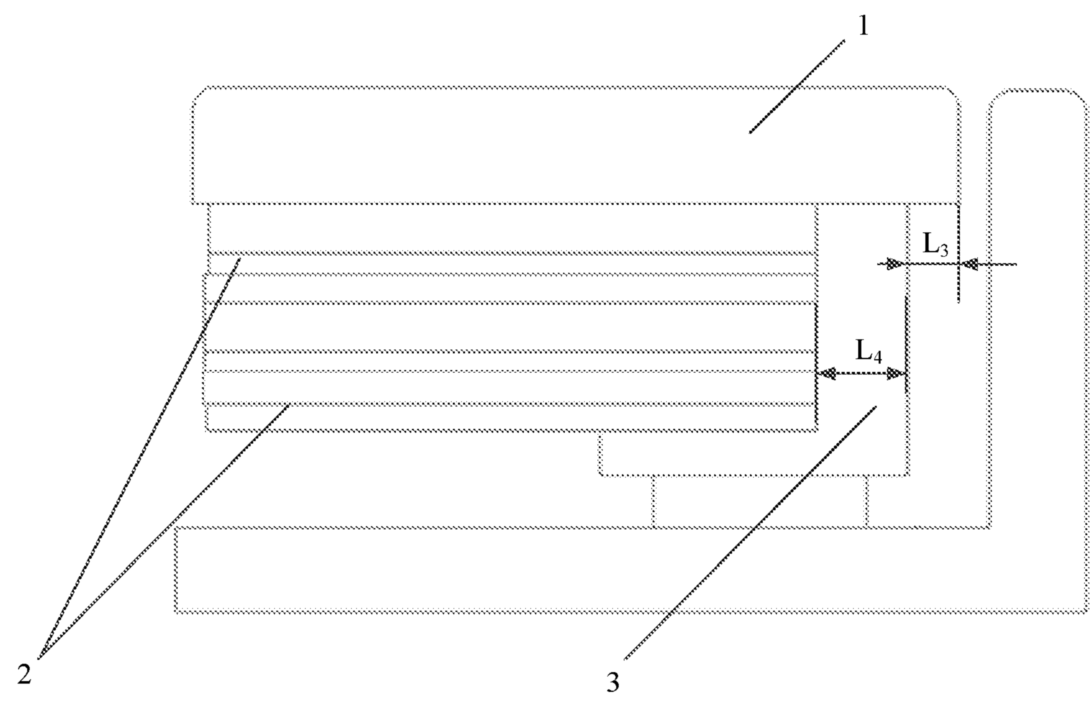
FIG. 11*b* is a schematic diagram of a structure of an embodiment of a terminal device according to this application.

As shown in FIG. 11*b*, in a specific implementation, in another region of the display panel layer 2 in which the bending portion is not arranged, a distance $L_3$ between the end of the module sealant 3 away from the display panel layer 2 and an edge of the cover plate 1 in the screen module 100 provided in this application is 0.10 mm, and a minimum distance $L_4$ between the display panel layer 2 and the end of the module sealant 3 away from the display panel layer 2 is 0.40 mm, where a total is 0.50 mm. Compared with that an avoidance distance $C_1$ between a side edge of the existing display panel layer and a side edge of the cover plate 1 usually needs to be greater than 0.90 mm, and a side-edge gain is greater than 0.40 mm.

This application may also be applied to designing other structures of the screen module other than the display panel layer.

The solutions and process routes described above are only preferred implementations of this patent, and are not intended to limit the implementation. It should be noted that other designs may also be made without departing from this patent. Therefore, apparent changes or modifications derived from this patent should also be considered to fall within the scope of protection of this patent.

What is claimed is:

1. A terminal device, comprising:

a screen module, wherein the screen module comprises a support layer, a display panel layer arranged above the support layer, a cover plate arranged above the display panel layer, and a module sealant;

wherein an edge of the display panel layer comprises a bending portion, the bending portion first extends toward a direction away from the cover plate and away from a center of the screen module, and then extends toward a direction away from the cover plate and closer to the center of the screen module, to enable the display panel layer to be bent from above the support layer around an edge of the support layer to below the support layer; and wherein the module sealant is arranged in a gap between the bending portion and the support layer; and the module sealant is further arranged on a side of the bending portion facing away from the support layer, a first end of the module sealant is connected to a surface of the cover plate facing toward the display panel layer, and a second end extends below the display panel layer, to enable the bending portion to be fully covered in the module sealant;

wherein the display panel layer extends from an end of the bending portion that is farthest away from the cover plate to below the support layer, to form a first extending portion;

wherein a thickness of the module sealant in a direction perpendicular to a major surface of the cover plate is greater than a distance between a surface of the first extending portion that faces away from the cover plate and the cover plate; and wherein a first sidewall of the module sealant extends in the direction perpendicular to the major surface of the cover plate, a second sidewall of the cover plate extends in the direction that is perpendicular to the major surface of the cover plate, the second sidewall of the cover plate defines an edge of the cover plate in a plan view, and the first sidewall of the module sealant is laterally between the end of the bending portion and the second sidewall of the cover plate.

2. The terminal device according to claim 1, wherein the thickness of the module sealant in the direction perpendicular to the cover plate is greater than a distance between the cover plate and the end of the bending portion that is farthest away from the cover plate, to enable the bending portion to be fully covered in the module sealant.

3. The terminal device according to claim 1, further comprising: a middle frame, wherein the middle frame comprises a bottom plate, a second extending portion is arranged around an edge of the bottom plate, and the second extending portion extends by a height toward a direction closer to the screen module, to form a cavity; and the screen module is arranged in the cavity, a lower surface of the cover plate is below an upper surface of the middle frame, and the module sealant, the cover plate, and the middle frame form a gap on a side facing the bending portion.

4. The terminal device according to claim 3, wherein the screen module further comprises a connecting portion; the cavity is defined by a bottom surface; and the connecting portion is arranged between the bottom surface and the module sealant, a first end of the connecting portion is connected to an end of the module sealant that is farthest away from the cover plate, and a second end of the connecting portion is connected to the bottom surface.

5. The terminal device according to claim 4, further comprising: a fastening component, wherein the fastening component is arranged on a side of the terminal device that comprises the bending portion, a first end of the fastening component is arranged on an outer end surface of the middle frame, and a second end of the fastening component is arranged in the module sealant, to enable the fastening component to pass through the middle frame and the gap and to be connected to the module sealant.

6. The terminal device according to claim 4, wherein the module sealant comprises a U-shaped region, and the U-shaped region is located at the end of the module sealant that is farthest away from the cover plate; and the connecting portion is arranged on the U-shaped region.

7. The terminal device according to claim 4, wherein a shape and a size of the connecting portion are adapted to a shape and a size of an end surface of the module sealant that faces the bottom plate.

8. The terminal device according to claim 1, wherein in another region of the display panel layer in which the bending portion is not arranged, the module sealant is arranged around a whole edge of the display panel layer, and an end surface of the module sealant in the another region is located between a side-surface edge of the display panel layer and the edge of the cover plate.

9. A seal jig for a screen module, wherein the screen module comprises a support layer, a display panel layer arranged above the support layer, a cover plate arranged above the display panel layer;

wherein an edge of the display panel layer comprises a bending portion, the bending portion first extends toward a direction away from the cover plate and away from a center of the screen module, and then extends toward a direction away from the cover plate and closer to the center of the screen module, to enable the display panel layer to be bent from above the support layer around an edge of the support layer to below the support layer;

wherein the seal jig is arranged next to the bending portion, a first end of the seal jig is connected to the cover plate, a second end of the seal jig is lapped with an end surface of the display panel layer that faces away from the cover plate, to enable the seal jig, the cover plate, and the display panel layer to form a cavity; and wherein a first sidewall of the cavity extends in a direction perpendicular to a major surface of the cover plate, a second sidewall of the cover plate extends in the direction that is perpendicular to the major surface of the cover plate, the second sidewall of the cover plate defines an edge of the cover plate in a plan view, and the first sidewall of the cavity is laterally between an end of the bending portion and the second sidewall of the cover plate.

10. The seal jig according to claim 9, wherein a thickness of the cavity in the direction perpendicular to the cover plate is greater than a distance between the cover plate and the end of the bending portion that is farthest away from the cover plate.

11. The seal jig according to claim 9, wherein the cavity comprises a U-shaped region, and the U-shaped region is located at the end of the cavity that is farthest away from the cover plate.

12. A terminal device, comprising:

a screen module, wherein the screen module comprises a support layer, a display panel layer arranged above the support layer, a cover plate arranged above the display panel layer, and a module sealant;

wherein an edge of the display panel layer comprises a bending portion, the bending portion first extends toward a direction away from the cover plate and away from a center of the screen module, and then extends toward a direction away from the cover plate and closer to the center of the screen module, to enable the display panel layer to be bent from above the support layer around an edge of the support layer to below the support layer; and wherein the module sealant is arranged in a gap between the bending portion and the support layer, and the module sealant is further arranged on a side of the bending portion facing away from the support layer, a first end of the module sealant is connected to a surface of the cover plate facing toward the display panel layer, and a second end extends below the display panel layer, to enable the bending portion to be fully covered in the module sealant;

wherein the display panel layer extends from an end of the bending portion that is farthest away from the cover plate to below the support layer, to form a first extending portion;

wherein a thickness of the module sealant in a direction perpendicular to a major surface of the cover plate is greater than a distance between a surface of the first extending portion that faces away from the cover plate and the cover plate; and wherein an end of the module sealant that faces away from the cover plate wraps at least a part of the first extending portion in the module sealant; and wherein a first side surface of the display panel layer is parallel to a thickness direction of the cover plate, a second side surface of the module sealant is parallel to the thickness direction of the cover plate, and the second side surface of the module sealant is on a side of the first side surface that is away from the display panel layer.

13. The terminal device according to claim 12, further comprising:

a middle frame, wherein the middle frame comprises a bottom plate, a second extending portion is arranged around an edge of the bottom plate, and the second extending portion extends by a height toward a direction closer to the screen module, to form a cavity; and wherein the screen module is arranged in the cavity, a lower surface of the cover plate is below an upper surface of the middle frame, and the module sealant, the cover plate, and the middle frame form a gap on a side facing the bending portion.

14. The terminal device according to claim 13, wherein the screen module further comprises a connecting portion, the cavity is defined by a bottom surface, and the connecting portion is arranged between the bottom surface and the module sealant, a first end of the connecting portion is connected to the end of the module sealant that is farthest away from the cover plate, and a second end of the connecting portion is connected to the bottom surface.

15. The terminal device according to claim 14, further comprising:

a fastening component, wherein the fastening component is arranged on a side of the terminal device that comprises the bending portion, a first end of the fastening component is arranged on an outer end surface of the middle frame, and a second end of the fastening component is arranged in the module sealant, to enable the fastening component to pass through the middle frame and the gap and to be connected to the module sealant.

16. The terminal device according to claim 14, wherein the module sealant comprises a U-shaped region, and the U-shaped region is located at the end of the module sealant that is farthest away from the cover plate; and wherein the connecting portion is arranged on the U-shaped region.

17. The terminal device according to claim 14, wherein a shape and a size of the connecting portion are adapted to a shape and a size of an end surface of the module sealant that faces the bottom plate.

18. The terminal device according to claim 12, wherein the thickness of the module sealant in the direction perpendicular to the cover plate is greater than a distance between the cover plate and the end of the bending portion that is farthest away from the cover plate.

19. The terminal device according to claim 12, wherein in another region of the display panel layer in which the bending portion is not arranged, the module sealant is arranged around a whole edge of the display panel layer, and an end surface of the module sealant in the another region is located between a side-surface edge of the display panel layer and the edge of the cover plate.

* * * * *